(12) United States Patent
Menezo

(10) Patent No.: US 10,270,222 B2
(45) Date of Patent: Apr. 23, 2019

(54) SEMICONDUCTOR LASER SOURCE

(71) Applicant: Commissariat A L'Energie Atomique et aux Energies Alternatives, Paris (FR)

(72) Inventor: Sylvie Menezo, Voiron (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 392 days.

(21) Appl. No.: 15/399,312

(22) Filed: Jan. 5, 2017

(65) Prior Publication Data
US 2018/0261976 A1 Sep. 13, 2018

(30) Foreign Application Priority Data

Jan. 8, 2016 (FR) .................................. 16 50171

(51) Int. Cl.
*H01S 5/0687* (2006.01)
*H01S 5/02* (2006.01)
(Continued)

(52) U.S. Cl.
CPC ............ *H01S 5/0687* (2013.01); *H01S 5/021* (2013.01); *H01S 5/026* (2013.01);
(Continued)

(58) Field of Classification Search
CPC .. H01S 5/0687; H01S 5/06255; H01S 5/2031; H01S 5/1092; H01S 5/1071;
(Continued)

(56) References Cited

U.S. PATENT DOCUMENTS

2009/0135861 A1 5/2009 Webster et al.
2014/0153600 A1 6/2014 Luo et al.
(Continued)

FOREIGN PATENT DOCUMENTS

FR 3 007 589 A1 12/2014
GB 2 522 252 7/2015

OTHER PUBLICATIONS

Amnon Yariv et al. "Supermode Si/III-V hybrid lasers, optical amplifiers and modulators: A proposal and analysis", Optics Express, vol. 15, No. 15, 2007, 5 pages.
(Continued)

*Primary Examiner* — Dung Nguyen
(74) *Attorney, Agent, or Firm* — Oblon, McClelland, Maier & Neustadt, L.L.P.

(57) ABSTRACT

A semiconductor laser source wherein a waveguide in which a filter is produced is made of a material that is less sensitive to temperature. The laser source also includes a tuning device able to shift the possible resonant wavelengths $\Delta\lambda_{Rj}$ of a Fabry-Pérot optical cavity in response to an electrical controlling signal, a sensor able to measure a physical quantity representative of the difference between a central wavelength $\lambda_{Cf}$ of the filter and one of the possible wavelengths $\lambda_{Rj}$, and an electronic circuit able to generate, depending on the physical quantity measured by the sensor, the electrical signal controlling the tuning device in order to keep one wavelength $\lambda_{Rj}$ at the center of each passband of the filter that selects an emission wavelength $\lambda_{Li}$ of the laser source.

13 Claims, 7 Drawing Sheets

(51) Int. Cl.
    *H01S 5/10*     (2006.01)
    *H01S 5/14*     (2006.01)
    *H01S 5/026*     (2006.01)
    *H01S 5/0625*     (2006.01)
    *H01S 5/20*     (2006.01)
    *H01S 5/30*     (2006.01)

(52) U.S. Cl.
    CPC ........ *H01S 5/06255* (2013.01); *H01S 5/1028* (2013.01); *H01S 5/1032* (2013.01); *H01S 5/1071* (2013.01); *H01S 5/1092* (2013.01); *H01S 5/14* (2013.01); *H01S 5/141* (2013.01); *H01S 5/142* (2013.01); *H01S 5/2031* (2013.01); *H01S 5/3013* (2013.01)

(58) Field of Classification Search
    CPC .......... H01S 5/1028; H01S 5/026; H01S 5/14; H01S 5/3013
    See application file for complete search history.

(56) References Cited

U.S. PATENT DOCUMENTS

| | | | |
|---|---|---|---|
| 2014/0153601 | A1 | 6/2014 | Doerr et al. |
| 2014/0376857 | A1 | 12/2014 | Chantre et al. |
| 2015/0180201 | A1* | 6/2015 | Zhang .................... H01S 3/005 372/20 |
| 2015/0207291 | A1 | 7/2015 | Rickman et al. |
| 2016/0164246 | A1 | 6/2016 | Rickman et al. |
| 2017/0324218 | A1* | 11/2017 | Krishnamoorthy ... H01S 3/0637 |

OTHER PUBLICATIONS

Zhou Fang et al. "Recent Progress in Silicon Photonics: A Review", International Scholarly Research Network, vol. 2012, 2012, 28 pages.

A.Descos et al. "Heterogeneously Integrated III-V/Si Distributed Bragg Reflector Laser with Adiabatic Coupling", Th.1.B.2.pdf, 3 pages.

G.T. Reed et al. "Silicon Optical Modulators", Nature Photonics, 2010, 10 pages.

Dimitris Fitsios et al. "High-gain 1.3μm GaInNAs semiconductor optical amplifier with enhanced temperature stability for all-optical signal processing at 10 Gb/s", Research Gate, 2015, 8 pages.

Alexander W. Fang et al. " Electrically pumped hybrid AlGaInAs-Silicon evanescent laser", Optics Express, vol. 14, No. 20, 2006, 8 pages.

Martijn J.R. Heck et al. " Ultra-low loss waveguide platform and its integration with silicon photonics", Laser & Photonics Reviews, 2014, 20 pages.

Frederic Boeuf et al. "Silicon Photonics Research for CMOS compatible Optical Interconnects at 40Gb/s and beyond", 2012 IEEE, 2012, 5 pages.

B. Ben Bakir et al. " Hybrid Si/III-V lasers with adiabatic coupling", $8^H$ $8^{th}$ IEEE International Conference on Group IV Photonics, 3 pages.

Winnie N. Ye et al. "Topical Review: Review of silicon photonics: history and recent advances", Journal of Modern Optics, 2013, 23 pages.

Ashish Dhiman "Silicon Photonics: A Review", IOSR Journal of Applied Physics, vol. 3, Issue 5, 2013, 13 pages.

Martijn J.R. Heck et al. "Hybrid Silicon Photonic Integrated Circuit Technology", JSTQE-INV-SL-04600-2012, 18 pages.

French Preliminary Search Report dated Sep. 30, 2016 in French Application 16 50171, filed on Jan. 8, 2016 (with English Translation of Categories of Cited Documents and Written Opinion).

Nobuhide Fujioka et al. "Compact and Low Power Consumption Hybrid Integrated Wavelength Tunable Laser Module Using Silicon Waveguide Resonators", Journal of Lightwave Technology, vol. 28, No. 21, 2010, 6 pages.

* cited by examiner

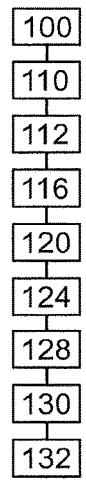
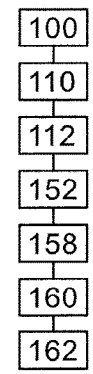
Fig. 9
Fig. 15
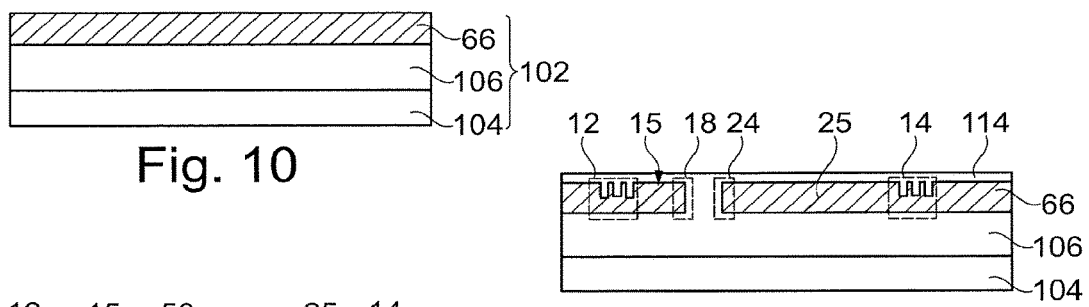
Fig. 10
Fig. 11
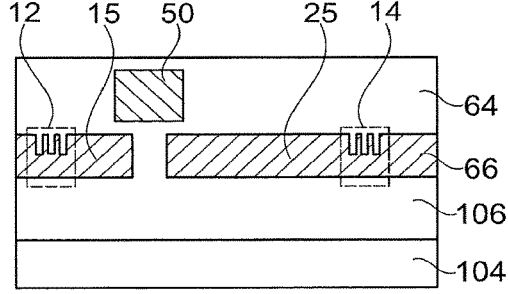
Fig. 12
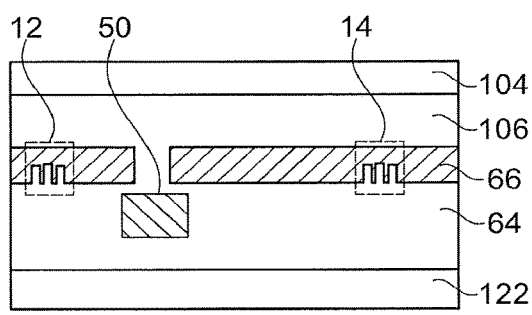
Fig. 13

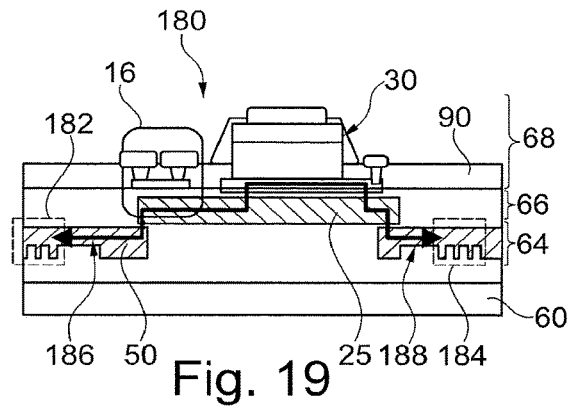
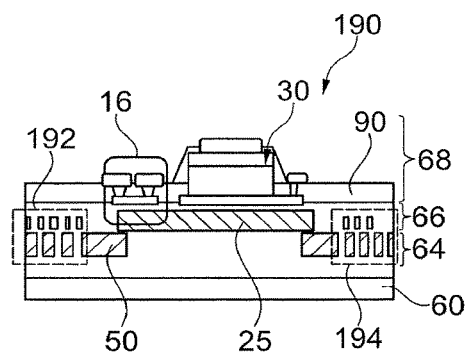
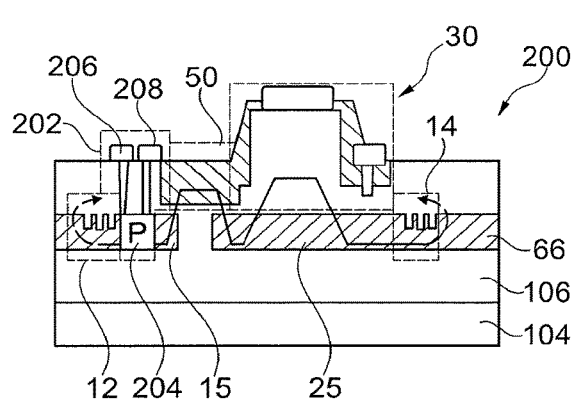
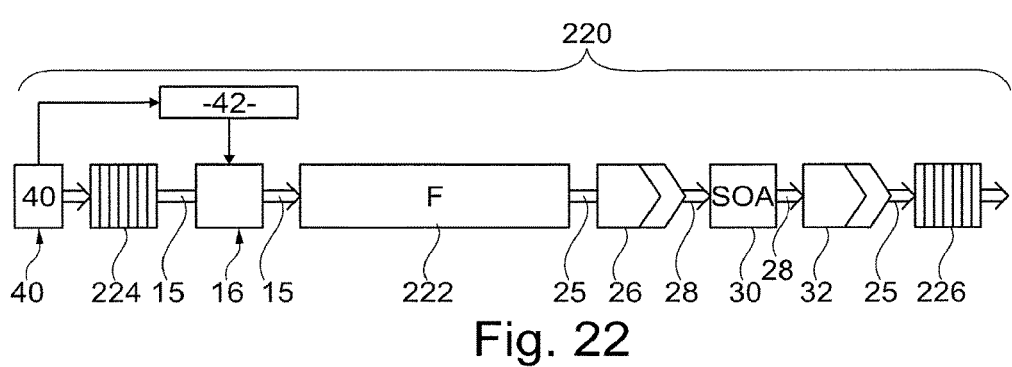

SEMICONDUCTOR LASER SOURCE

The invention relates to a semiconductor laser source able to emit at least one wavelength $\lambda_{Li}$, and to a process for manufacturing this laser source.

Laser sources known to the inventors include:
a front reflector and a back reflector, these front and back reflectors forming the ends of a Fabry-Pérot optical cavity able to make resonate an optical signal at a plurality of possible resonant frequencies, the possible wavelengths $\lambda_{Rj}$ of these possible resonant frequencies being regularly spaced apart from one another by an interval $\Delta\lambda_R$ and all comprised inside a reflection band of the front and back reflectors, which band is centred on a wavelength $\Delta_{CR}$ and of width $\Delta R$,
a set of waveguides optically connecting the front and back reflectors together, this set including:
a waveguide made of silicon,
a passband filter produced in a waveguide and arranged to be passed through by the optical signal resonating between the front and back reflectors, this passband filter being able to select at least one wavelength $\lambda_{Li}$ from the wavelengths $\lambda_{Rj}$, the passband filter including for this purpose a passband centred on each wavelength $\lambda_{Li}$ to be selected, each passband of the filter being centred on a respective central wavelength $\lambda_{Cf}$ and having a bandwidth $\Delta\lambda_R$ smaller than or equal to the interval $\Delta\lambda_R$,
a waveguide made of III-V gain material able to generate optical gain at each wavelength $\lambda_{Li}$ selected by the filter and arranged to be passed through by the optical signal resonating between the front and back reflectors, this waveguide being coupled to the waveguide made of silicon by adiabatic coupling that is able to convert a guided optical mode of the waveguide made of silicon into a guided optical mode of the waveguide made of III-V gain material.

In these laser sources known to the inventors, the filter and the reflectors are produced in waveguides made of silicon and the filter selects only a single wavelength.

When the operating temperature of the known laser sources varies, the emission wavelength of these laser sources also varies at a rate of about 0.07 nm/° C. For this reason, it is said that these known laser sources are sensitive to temperature and that the emission wavelength of the laser source drifts as a function of temperature.

To remedy this drawback, it is known to associate the laser source with a device for regulating its operating temperature in order to keep it at a constant temperature. However, such regulating devices are bulky and consume a lot of power.

Prior art is also known from:
US2015/180201A1,
NOBUHIDE FUJIOKA et al: "Compact and Low Power Consumption Hybrid Integrated Wavelength Tunable Laser Module Using Silicon Waveguide Resonators", Journal of Lightwave Technology, IEEE Service Center, US, vol. 28, no. 21, Jan. 11, 2010,
US2014/153600A1,
US2014/153601A1,
GB2522252A,
US2009/135891A1.

The invention aims to remedy this drawback by providing a semiconductor laser source that is less sensitive to temperature variations while remaining simple to manufacture. One of its subjects is therefore a semiconductor laser source according to Claim 1.

To limit the temperature drift of the claimed laser source, the proposed solution consists in producing the filter in a waveguide that instead of being made of silicon is made from a material that is less sensitive to temperature, and in integrating this filtering to the structure of the laser source. Specifically, the fact that the waveguide in which the filter is produced is made from a material the variation in the refractive index as a function of temperature of which is at least two times less rapid than the variation in the refractive index of silicon allows the temperature drift of the filter to be limited. In addition, the tuning device, the sensor and the electronic circuit allow one wavelength $\lambda_{Rj}$ to be kept permanently at the centre of each passband of the filter that selects a wavelength $\lambda_{Li}$. The consequence of this is to decrease the amplitude of the drift in the emission wavelength $\lambda_{Li}$ of the laser source with temperature without it being necessary to have recourse to a device for regulating the temperature of the laser source.

The integration into the laser source of this filter is made possible by the use of a laser-source structure comprising three waveguides, namely a waveguide made of silicon, a waveguide made of III-V gain material and a waveguide made of material that is less sensitive to temperature. This three-waveguide structure especially makes it possible to get around the difficulty according to which it is difficult to achieve adiabatic coupling directly between the waveguide made of material that is less sensitive to temperature and the waveguide made of III-V gain material. Specifically, the materials of these two waveguides generally have large differences in optical refractive index. In the claimed laser source, it is therefore proposed to use a waveguide made of silicon to couple, on the one hand, the waveguide made of III-V gain material to the waveguide made of silicon and, on the other hand, the waveguide made of silicon to the waveguide made of material that is less sensitive to temperature. Thus, the waveguides made of III-V gain material and of material that is less sensitive to temperature are coupled to each other by way of the waveguide made of silicon. In addition, the presence of the waveguide made of silicon may be taken advantage of to manufacture a particularly effective tuning device. Specifically, the variation in the refractive index of silicon as a function of temperature is substantial and it is also possible to generate free carriers in a waveguide made of silicon simply. These two effects modify the phase of any optical signal propagating through the silicon waveguide Embodiments of this laser source may have one or more of the features of the dependent claims.

These embodiments of the laser source furthermore have the following advantages:
  The use of a ring resonator by way of filter allows the bulk of the filter and therefore the bulk of the semiconductor laser source to be limited.
  The use of a ring resonator a plurality of passbands of which are comprised inside the reflection band of the reflectors allows a multi-wavelength laser source to be produced simply. In particular, one and the same gain material is used for the various emission wavelengths of this multi-wavelength laser source.
  The use of a ring resonator also allows the filter to be directly connected to the waveguide made of silicon solely by way of evanescent coupling and without recourse to adiabatic coupling. This allows the bulk of the laser source to be decreased while avoiding recourse to adiabatic couplers. Specifically, in this case, only the ring resonator is produced from a material that is less sensitive to temperature.

Manufacturing the filter on one side of a layer containing the waveguides made of silicon and manufacturing, on the opposite side, the waveguide made of gain material, simplifies the bonding of the layer containing the gain material to the silicon. This also makes much more precise etching of the filter possible.

The fact that the tuning device is produced, above the silicon waveguide, and in the same sublayer made of doped material as that which is used to form the waveguide made of gain material simplifies the manufacture of the tuning device. Specifically, the operations for manufacturing the tuning device and the waveguide made of gain material may then be carried out simultaneously. In addition, this type of tuning is lossless as regards the optical mode of the cavity, contrary to tuning devices making use of p-n or p-i-n junctions produced in the waveguide made of silicon.

The use of silicon nitride or aluminium nitride by way of material that is less sensitive to temperature allows the sensitivity of the laser source to temperature to be divided by at least five.

Producing the reflectors at least partially in the material that is less sensitive to temperature allows their sensitivity to temperature to be limited. This allows reflectors the width ΔR of the reflection band of which is smaller to be used.

Another subject of the invention is a process for manufacturing the claimed laser source.

The invention will be better understood on reading the following description, which is given merely by way of nonlimiting example and with reference to the appended drawings, in which:

FIG. 9 is a flowchart of a process for manufacturing the laser source in FIG. 8;

FIGS. 10 to 14 are schematic illustrations, in vertical cross section, of various stages of manufacture of the laser source in FIG. 8;

FIG. 15 is a flowchart of another process for manufacturing a semiconductor laser source;

FIGS. 19 to 21 are schematic illustrations, in vertical cross section, of various variant embodiments of a semiconductor laser source;

FIG. 22 is a schematic illustration of various elements of a multi-wavelength laser source;

In these figures, the same references are used to designate the same elements. In the rest of this description, features and functions that are well known to those skilled in the art are not described in detail.

The reason why the production of the filter in a waveguide made of material that is less sensitive to temperature decreases the sensitivity of the laser source to temperature will firstly be explained in detail with reference to FIGS. 1 to 3. Next, the general architecture of a semiconductor laser source using such a filter is described followed by a plurality of particular exemplary embodiments.

Figure 1:
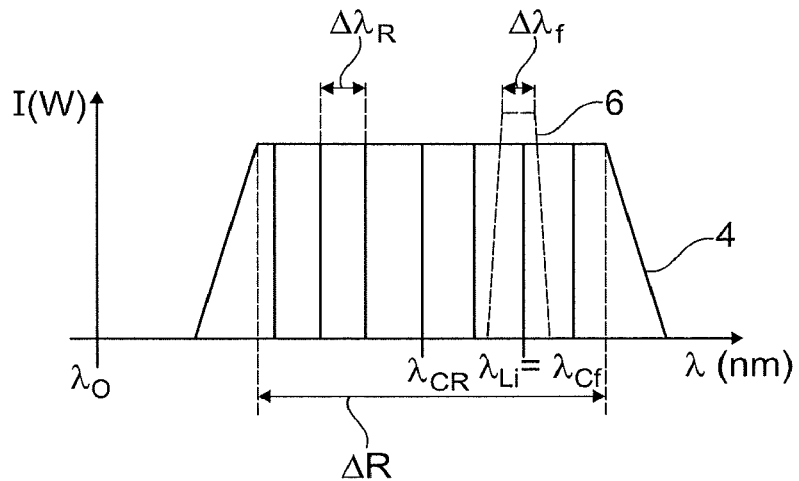
FIGS. 1 to 3 are schematic representations of the position of the reflection band of the reflectors of a semiconductor laser source with respect to the passband of the filter of the semiconductor laser source.

FIG. 1 shows a reflection band 4 of the front and back reflectors of a Fabry-Pérot optical cavity of a known semiconductor laser source. This passband 4 is shown on a graph the x-axis of which represents wavelength and is expressed in nm and the y-axis of which corresponds to the power of the optical signal expressed in watts.

The reflection band 4 is characterized by its width ΔR and its central wavelength $\lambda_{CR}$. The width ΔR is the width of the reflection band 4 at −3 dB. It is a question of the band of wavelengths containing all the wavelengths $\lambda_{Rj}$ able to be reflected by the front and back reflectors with a power higher than or equal to 50% of the maximum power $I_{max}$ reflected by these reflectors. The power $I_{max}$ is equal to the power of the optical signal reflected at the wavelength $\lambda_{Rj}$ at which this power is maximum.

The central wavelength $\lambda_{CR}$ is the wavelength located in the middle of the reflection band 4.

In the context of a Fabry-Pérot cavity, the various wavelengths $\lambda_{Rj}$ at which this cavity is liable to resonate are regularly spaced apart from one another by an interval $\Delta\lambda_R$. In FIG. 1, the wavelengths $\lambda_{Rj}$ at which the Fabry-Pérot cavity is able to resonate and that are located inside the passband 4 are represented by vertical lines.

In the context of a monochromatic laser source that emits at a single wavelength $\lambda_{Li}$, the filter selects from all of the possible wavelengths $\lambda_{Rj}$ one of these wavelengths $\lambda_{Rj}$. The selected wavelength $\lambda_{Rj}$ is equal to the emission wavelength $\lambda_{Li}$ of the laser source. To this end, the filter has a single narrow passband 6 centred on the wavelength $\lambda_{Li}$. This passband 6 is characterized by its width $\Delta\lambda_f$ and by its central wavelength $\lambda_{Cf}$. The width $\Delta\lambda_f$ is the width of the passband 6 at −3 dB. The central wavelength $\lambda_{Cf}$ is the wavelength located in the middle of the passband 6. To select the single wavelength $\lambda_{Li}$, the width $\Delta\lambda_f$ is smaller than or equal to the interval $\Delta\lambda_R$. To select the wavelength $\lambda_{Li}$, one of the wavelengths $\lambda_{Rj}$, typically the closest to $\lambda_{Cf}$, is tuned to be equal to this wavelength $\lambda_{Cf}$. This wavelength $\lambda_{Rj}$ that is equal to the wavelength $\lambda_{Cf}$ corresponds to the wavelength $\lambda_{Li}$.

The graph in FIG. 1 is shown for an operating temperature of the laser source equal to 20° C.

In known laser sources, the optical signal is guided between the front and back reflectors by waveguides made of silicon and of III-V gain materials. The reflectors and the filter are produced in waveguides made of silicon, and the gain function is provided in the waveguide made of III-V materials. Under these conditions, it is known that the wavelengths $\lambda_{Rj}$ and the wavelength $\lambda_{CR}$ move as a function of temperature at about 0.07 nm/° C. The wavelength $\lambda_{Cf}$ also moves at about 0.07 nm/° C.

Figure 2:
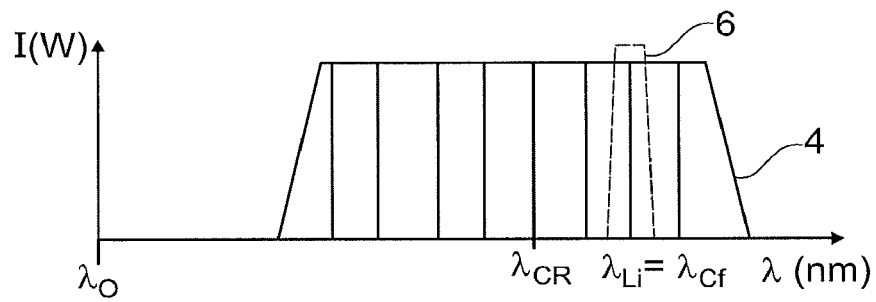

The graph in FIG. 2 shows the same elements as the graph in FIG. 1, but for an operating temperature of the laser source equal to 33° C. It may be seen that the passband 4 and the wavelengths $\lambda_{CR}$ and $\lambda_{Rj}$ have moved by about 0.9 nm (about 0.07×13° C.) and that the passband 6 has moved by about 0.9 nm. The wavelength $\lambda_{Li}$ of the laser source has therefore moved by about 0.9 nm.

To limit this drift in the wavelength $\lambda_{Li}$, the proposed solution consists in producing the filter in a waveguide that instead of being made of silicon is made from a material that is less sensitive to temperature, and in integrating this filter into the structure of the laser source. Here, a material that is less sensitive to temperature is a material the variation $dn_f/dT$ of the refractive index of which as a function of temperature is at least two times lower, under the same conditions, as the variation $dn_{Si}/dT$ in the refractive index of silicon as a function of temperature. Typically, the variation $dn_{Si}/dT$ is equal to $2.3 \times 10^{-4}$/° C. to within plus or minus 20%. Thus, the variation $dn_f/dT$ is at least lower than $1 \times 10^{-4}$/° C. and, preferably, lower than $0.5 \times 10^{-4}$/° C. Below, the particular case where the material that is less sensitive to temperature is silicon nitride ($Si_3N_4$), the variation $dn_f/dT$ of which is equal to $0.4 \times 10^{-4}$/° C., is described. However, as described in detail at the end of this description, other materials are possible. The refractive index of silicon nitride varies as a function of temperature 6 to 7 times less rapidly than that of silicon. Therefore, the central wavelength $\lambda_{Cf}$ of the filter produced in a waveguide made of silicon nitride moves, as a function of temperature, only at 0.01 nm/° C.

Figure 3:
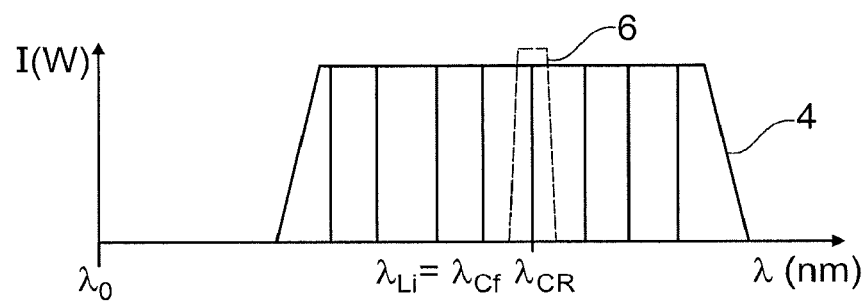

FIG. 3 shows the position of the reflection band 4 and of the passband 6 in the case where the filter is produced in a waveguide made of silicon nitride and for an operating temperature of the laser source of 33° C. As the graph in FIG. 3 shows, the central wavelength $\lambda_{Cf}$ of the filter only moves 0.13 nm (=0.01×13° C.) in response to an increase of 13° C. in the operating temperature of the laser source. In contrast, the amplitude of the movement of the central wavelength $\lambda_{CR}$ is the same as in the case shown in FIG. 2. However, solely producing the filter in a material that is less sensitive to temperature is alone enough to very greatly limit the sensitivity of the wavelength $\lambda_{Cf}$ to temperature. Since it is the filter that selects the emission wavelength $\lambda_{Li}$ of the laser source, it becomes possible, after a wavelength $\lambda_{Rj}$ has been centred on the wavelength $\lambda_{Cf}$, to obtain a laser-source emission wavelength $\lambda_{Li}$ that is less sensitive to temperature.

As will be seen below, in the laser source described, a tuning device, a sensor and an electronic controlling circuit are used to automatically and correctly centre the closest of the wavelengths $\lambda_{Rj}$ on the centre of the passband 6 of the filter in order to obtain a laser-source emission at the wavelength $\lambda_{Li}$. Specifically, since the passband 6 of the filter moves much less rapidly than the wavelengths $\lambda_{Rj}$, if nothing is done to correctly centre one of the wavelengths $\lambda_{Rj}$ on the centre of the passband 6, this passband 6 may contain no wavelength $\lambda_{Rj}$ or a wavelength $\lambda_{Rj}$ that is poorly centred, thereby suppressing the emission of the laser source or greatly limiting the power of the emitted optical signal.

Figure 4:
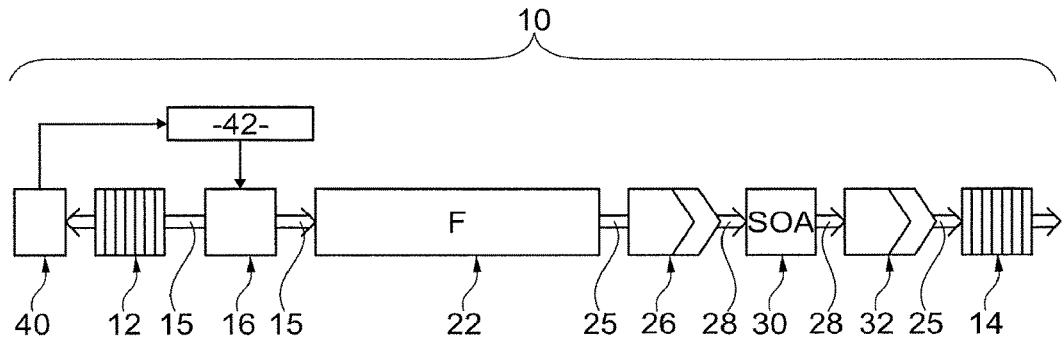
FIG. 4 is a schematic illustration of the architecture of a semiconductor laser source.

FIG. 4 schematically shows the general architecture of a monochromatic semiconductor laser source 10 that emits at the wavelength $\lambda_{Li}$. The laser source 10 includes a back reflector 12 and a front reflector 14 that define the ends of the Fabry-Pérot cavity inside of which the optical signal resonates. For example, the reflector 12 has a reflection coefficient strictly higher than that of the reflector 14. The reflection coefficient is equal to the ratio of the power of the optical signal reflected by the reflector to the power of the optical signal incident on this reflector. Typically, the reflection coefficient of the reflector 12 is higher than or equal to 90% or 95% at the wavelength $\lambda_{Li}$. The reflection coefficient of the reflector 14 is generally comprised between 30% and 70% and is typically 50%.

The reflectors 12 and 14 are wideband reflectors. In this embodiment, this means that the width $\Delta R$ of the reflection band 4 of the reflectors 12 and 14 is strictly larger than $\Delta\lambda_f + DT \times (d\lambda_{CR}/dT)$, where:

$\Delta\lambda_f$ is the width of the passband 6 of the filter that selects the wavelength $\Delta\lambda_{Li}$ expressed in nm, DT is the width of the preset range of operating temperatures of the laser source 10, expressed in ° C., and $d\lambda_{CR}/dT$ is the variation in the central wavelength $\lambda_{CR}$ of the reflection band of the reflectors 12 and 14 as a function of temperature, expressed in nm/° C.

The range of operating temperatures of a laser source is often at the present time chosen so that, whatever the operating temperature of the laser source in this range, the wavelength $\lambda_{Li}$ does not vary by more than 0.35 nm. Thus, for example, the width DT of this range may be larger than 10° C. or 30° C. To meet this criterion, here the range of operating temperatures is chosen to be comprised between +20° C. and +55° C. The width DT is therefore here equal to 35° C. Below, the lowest and highest temperatures of the range of operating temperatures are denoted $T_{min}$ and $T_{max}$, respectively. In this embodiment, the reflectors 12 and 14 are produced in a waveguide made of silicon. Thus, the variation $d\lambda_{CR}/dT$ is here equal to 0.07 nm/° C. As described with reference to FIGS. 1 to 3, the width $\Delta\lambda_f$ is smaller than the interval $\Delta\lambda_R$. Typically, the interval $\Delta\lambda_R$ is smaller than or equal to 0.5 nm. For example, here the interval $\Delta\lambda_R$ is equal to 0.3 nm to within 15% or 30%. Thus, in this embodiment, the width $\Delta\lambda_f$ is smaller than or equal to 0.3 nm. The width $\Delta R$ is therefore here strictly larger than 2.75 nm (=0.07×35+0.3).

The reflectors 12 and 14 are also designed so that, at the temperature $T_{min}$, the wavelength $\lambda_{Li}$ is closer to the upper limit $\lambda_{Rmax}$ of the reflection band 4 than its lower limit $\lambda_{Rmin}$. For example, at the temperature $T_{min}$, the wavelength $\lambda_{Li}$ is comprised between 0.9 $\Delta_{Rmax}$ and $\lambda_{Rmax}$. This constraint may be relaxed if the width $\Delta R$ is very much larger than $\Delta\lambda_f + DT \times (d\lambda_{CR}/dT)$. Specifically, in the latter case, in order for the wavelength $\lambda_{Li}$ to be contained inside the reflection band 4 whatever the operating temperature of the laser source 10 between $T_{min}$ and $T_{max}$, it is not necessary for the wavelength $\lambda_{Li}$ to be close to $\lambda_{Rmax}$.

Here, the reflectors 12 and 14 are for example reflectors such as Bragg gratings.

Between the reflectors 12 and 14, the laser source includes the following photonic components in succession from the reflector 12 to the reflector 14:

an optical waveguide 15 made of silicon in which the reflector 12 is produced, a tuning device 16 able to move the wavelengths $\lambda_{Rj}$ depending on an electrical controlling signal and using the properties of the silicon of the waveguide 15, a passband filter 22 able to select the operating wavelength $\lambda_{Li}$ of the laser source 10 from the various wavelengths $\lambda_{Rj}$ that are possible in the Fabry-Pérot cavity, this filter 22 being produced in a waveguide made of silicon nitride, a waveguide 25 made of silicon, an adiabatic coupler 26 that optically connects the waveguide 25 to one entrance of the waveguide 28 made of III-V gain material, a semiconductor optical amplifier 30 (better known by the acronym SOA) produced in the waveguide 28 and able to generate and amplify the optical signal resonating inside the Fabry-Pérot cavity at each wavelength $\lambda_{Rj}$, and an adiabatic coupler 32 that optically connects one exit of the waveguide 28 to the waveguide 25 at the end in which the reflector 14 is produced.

Below, only the particularities of the laser source 10 are described in detail. For general information on the production and operation of a semiconductor laser source using waveguides made of silicon and of III-V gain material, the reader may consult the following article: B. Ben Bakir et al., "Hybrid Si/III-V lasers with adiabatic coupling", 2011.

For a detailed description of an adiabatic coupler, the reader may refer to the following article: Amnon Yariv et al., "Supermode Si/III-V hybrid Lasers, optical amplifiers and modulators: proposal and analysis" Optics Express 9147, vol. 14, no. 15, Jul. 23, 2007.

In particular, it will be recalled that an adiabatic coupler is able to convert an optical mode guided in a first waveguide made of silicon into an optical mode guided in a second waveguide made of III-V gain material. In particular, an adiabatic coupler is able to transfer almost all the optical signal present in the first waveguide to a second waveguide located above or below, without reflection. For example, the power, of the optical signal, transferred to the second waveguide is higher than or equal to 95% of the power of the optical signal circulating in the first waveguide. Such an adiabatic coupler is, for example, obtained by modifying the width of the first waveguide with respect to the width of the second waveguide. Typically, for adiabatic coupling from a waveguide made of silicon to a waveguide made of III-V material, the width of the waveguide made of silicon is gradually decreased as it approaches the waveguide made of III-V material. Conversely, to transfer by adiabatic coupling an optical signal from the waveguide made of III-V material to the first waveguide made of silicon, the width of the waveguide made of silicon is for example gradually increased. In addition, the waveguides made of silicon and of III-V material generally have a width such that their respective propagation indices are equal. This is also true for adiabatic coupling between hybrid Si/III-V waveguides.

In this embodiment, the filter 22 is a ring resonator filter, the ring of which is produced in a waveguide 50 (FIG. 5) made of $Si_3N_4$. Preferably, the waveguide 50 in which the ring is produced is optically directly connected to the waveguides 15 and 25 made of silicon by evanescent coupling. Evanescent coupling between a waveguide made of silicon and a waveguide made of silicon nitride is obtained by placing these two waveguides close together and by making the propagation indices of the two closely-spaced waveguides equal.

Figure 7:
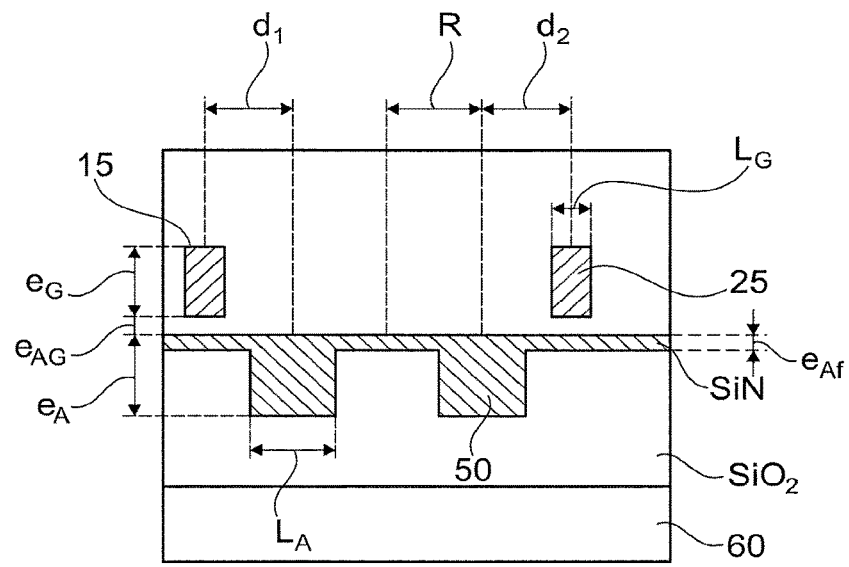
FIG. 7 is a schematic illustration, in vertical cross section, of the filter in FIG. 5 in the case where the waveguide made of silicon is coupled to the waveguide made of silicon nitride by evanescent coupling.

Evanescent coupling between a first and a second waveguide transfers a fraction of the power of the optical signal present in the first waveguide to the second waveguide. This fraction of the power is adjusted, for example, by adjusting the distance between the first and second waveguides. Here, the geometry and distance between the waveguides 15, 25 and the waveguide 50 in which the ring of the filter 22 is produced are adjusted so that the power, of the optical signal, transferred between the waveguide made of silicon and the waveguide 50 is comprised between 5% and 25% and, preferably, equal to 10% to within plus or minus 3% or 1%. The geometries of the waveguides are modified to make the propagation indices equal in both waveguides. Here, the width of the waveguides 15 and 25 made of silicon is for example decreased over a length L1 and L2, respectively, and that of the waveguide 50 made of $Si_3N_4$ is not modified. To adjust the coupled power, the distance between the two waveguides 15 and 50 and 25 and 50 is adjusted in a horizontal direction to a calculated distance $d_1$, $d_2$, respectively, as is described in more detail with reference to FIGS. 5 and 7.

The use of evanescent coupling between the waveguide 50 of the ring and the waveguides 15 and 25 made of silicon allows the bulk of the laser source to be limited while avoiding recourse to adiabatic couplers and to additional waveguides made of silicon nitride.

Adiabatic or evanescent coupling also has the advantage of limiting the reflection of the optical signals at the optical interface between two waveguides.

To generate the electrical signal for controlling the tuning device 16, the laser source 10 also includes:

a sensor 40 able to measure a physical quantity representative of the difference between the wavelength $\lambda_{Cf}$ and the closest of the wavelengths $\lambda_{Rj}$, and an electronic circuit 42 able to generate the electrical signal for controlling the tuning device 16 so as to permanently keep one wavelength $\lambda_{Rj}$ at the centre of the passband 6 of the filter 22.

For this purpose, here, the sensor 40 measures the power of the optical signal emitted by the laser source 10. In this embodiment, the resonant optical signal may exit the laser source 10 in two possible ways, namely either by passing through the reflector 14, or by passing through the reflector 12. Given that the reflection coefficient of the reflector 12 is higher than that of the reflector 14, the optical signal that exits by passing through the reflector 12 has a much lower power than the signal exiting through the reflector 14. Conventionally, the optical signal that exits by passing through the reflector 14 is called the "useful optical signal" and the signal that exits by passing through the reflector 12 is called the "optical control signal" or the "optical monitoring signal". Here, the sensor 40 measures the power of the optical signal that passes through the reflector 12. For example, the sensor 40 includes a photo detector that measures the power of the optical signal. The power thus measured is transmitted to the electronics circuit 42. This measured power is representative of the distance between the wavelengths $\lambda_{Cf}$ and the closest of the wavelengths $\lambda_{Rj}$. Specifically, the measured power is maximum when the wavelength $\lambda_{Cf}$ is aligned with one of the wavelengths $\lambda_{Rj}$. This power decreases monotonically as the wavelength $\lambda_{Rj}$ gets further from the wavelength $\lambda_{Cf}$ provided that it does not leave an interval of width $\Delta\lambda_R$ centred on the wavelength $\lambda_{Cf}$.

The electronics circuit 42 constructs the controlling signal that allows a wavelength $\lambda_{Rj}$ to be kept at the centre of the passband 6 depending on the physical quantity measured by the sensor 40. For this purpose, it is electrically connected to the sensor 40. In addition, it is electrically connected to the tuning device 16 in order to transmit thereto the generated electrical controlling signal. Typically, the sensor 40 is produced on the same substrate as the other photonic components of the laser source 10 and for example in the III-V gain material. The electronics circuit 42 is often added to this substrate.

Figure 5:
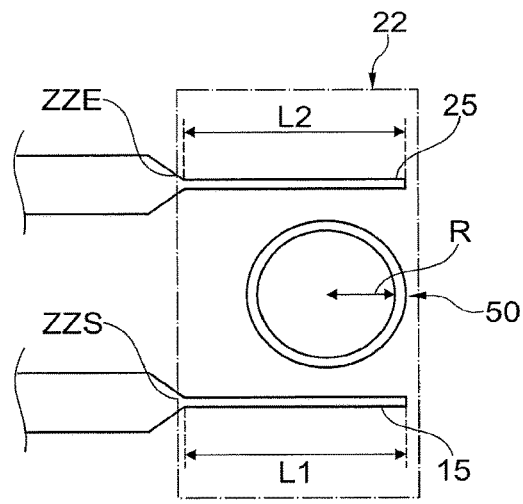
FIG. 5 is a schematic illustration, seen from above, of an exemplary ring-resonator filter able to be used in the laser source in FIG. 4.

FIG. 5 shows in greater detail the filter 22 in the case where the latter is produced using a ring resonator. Specifically, the waveguide 50 forms a ring that is directly optically connected to the waveguides 15 and 25, respectively, solely by evanescent coupling. This ring is therefore produced from silicon nitride, whereas the waveguides 15 and 25 are produced from silicon. In FIG. 5, the entrance and exit of the filter 22 are denoted ZZE and ZZS, respectively.

Figure 6:
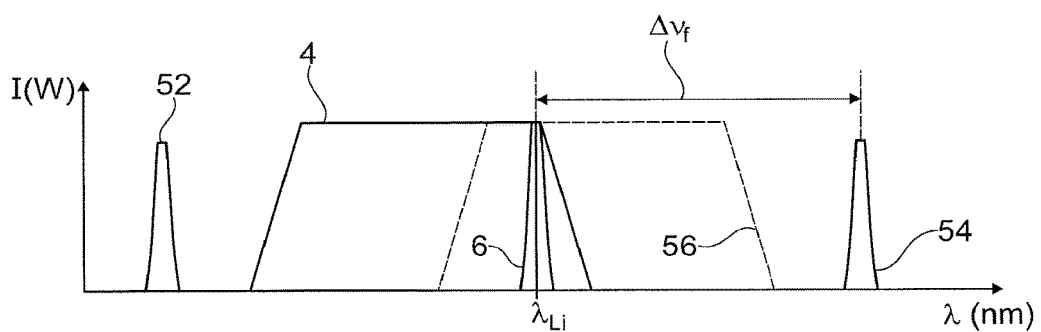
FIG. 6 is a graph schematically illustrating the position of the reflection band of the reflectors with respect to the passband of the filter in FIG. 5.

As shown in FIG. 6, the transmission spectrum of the filter 22 comprises a plurality of passbands that are regularly spaced apart from one another. Here, the central frequencies of 2 successive passbands are spaced apart from each other by an interval $\Delta v_f$. This interval $\Delta v_f$ is better known by the acronym FSR (free spectral range). In the graph in FIG. 6, only the passband 6 and two passbands 52 and 54 respectively located before and after the passband 6 have been shown.

Here, the dimensions of the filter 22 are determined by numerical simulation or experimentally so that the interval $\Delta v_f$ is strictly wider than the width $\Delta R$ of the reflection band 4. Thus, only one of the passbands of the filter 22, i.e. here the passband 6, is located inside the reflection band 4, whatever the operating temperature. Thus, the filter 22 allows just one single wavelength $\Delta\lambda_{Rj}$ to be selected and hence the laser source 10 is a monochromatic laser source. In the graph in FIG. 6, the selected wavelength is represented by a vertical bar of abscissa $\lambda_{Li}$.

For example, the values of the wavelength $\lambda_{Cf}$ and of the interval $\Delta v_f$ are set on the basis of the following parameters: the perimeter of the ring, the propagation index $n_{\it eff}$ of the waveguide 50, the group index $n_g$ of the waveguide 50 (i.e. the refractive group index) and the order of resonance K. By way of illustration, the wavelength $\lambda_{Cf}$ and the interval $\Delta v_f$ are estimated using the following relationships:

$$\lambda_{Cf} = \frac{\text{perimeter} \cdot n_{\it eff}(\lambda)}{K} \quad \Delta v_f \approx \frac{\lambda^2}{\text{perimeter}.n_g}$$

where "perimeter" is the perimeter of the ring produced in the waveguide 50 and $\lambda$ is the wavelength, of the optical signal, for which the wavelength $\lambda_{Cf}$ and the interval $\Delta v_f$ are calculated.

The width $\Delta\lambda_f$ may be determined from the propagation losses in the waveguide 50 of the ring and the coupling coefficients of the evanescent coupling between the waveguide 50 and the waveguides 15 and 25.

The graph in FIG. 6 shows the case where the operating temperature is equal to $T_{min}$. The dashed line 56 represents the position of the reflection band 4 when the operating temperature is equal to $T_{max}$. As illustrated in the graph in FIG. 6, whatever the operating temperature of the laser source between $T_{max}$ and $T_{min}$, the passband 6 is always located inside the reflection band 4 even if the latter moves because of temperature variations. In the graph in FIG. 6, the slight movement of the passband 6 as a function of temperature has not been shown.

The dimensions of the filter 22 are also defined to obtain the properties desired for the evanescent coupling between the waveguide 50 of the ring and the waveguides 15 and 25 and in particular the desired degree of transfer of power between the waveguides 15, 25 and the waveguide 50. For example, the defined dimensions of the filter 22 are especially chosen from the following dimensions:
the radius of the ring R,
the lengths L1 and L2 over which the width of the waveguides 15 and 25 are decreased so as to make the propagation indices of the waveguides 15 and 25 and 50 equal,
the distances $d_1$ and $d_2$,
the thicknesses $e_A$, $e_{Af}$ and the width $L_A$ of the waveguide 50 of the filter 22,
the thickness $e_G$ and the width $L_G$ of the waveguides 15 and 25 in the case of evanescent coupling, and
the vertical space $e_{AG}$ made of silicon oxide that separates the waveguide 50 and the waveguides 15 and 25.

The dimensions L1 and L2 are shown in FIG. 5. The dimensions $d_1$, $d_2$, $e_G$, $L_G$, $e_{AG}$, $e_A$ $e_{Af}$ and $L_A$ are shown in the vertical cross section passing through the centre of the ring 50 and perpendicular to the waveguides 15 and 25 in FIG. 7. In this cross section, the waveguides 15 and 25 and 50 are located in respective horizontal layers that are superposed on one another in the vertical direction. These layers are parallel to the plane in which a substrate 60 mainly extends, on which the various layers used to manufacture the laser source 10 are stacked. This plane is called the "plane of the substrate" below. In the following figures, the plane of the substrate is always horizontal.

By way of illustration, typically:
the distances $d_1$ and $d_2$ are comprised between 0 μm and 3 μm,
the thickness $e_G$ is comprised between 100 nm and 500 nm,
the width $L_G$ is comprised between 100 nm and 500 nm,
the thickness $e_{AG}$ is comprised between 0 nm and 200 nm,
the thickness $e_A$ is comprised between 50 nm and 700 nm,
the width $L_A$ is comprised between 500 nm and 1 μm, and
the radius of the ring 50 is comprised between 3 μm and 100 μm.

For example, to obtain a degree of transfer of power of 10% between the waveguide 15 and the waveguide 50 of the ring, the following are possible dimensions: R=30 μm, L1=60 μm, $e_G$=300 nm, $e_{AG}$=50 nm, $L_G$=180 nm, $e_A$=500 nm, $e_{AF}$=50 nm, $L_A$=700 nm, $d_1$=1.1 μm.

Figure 8:
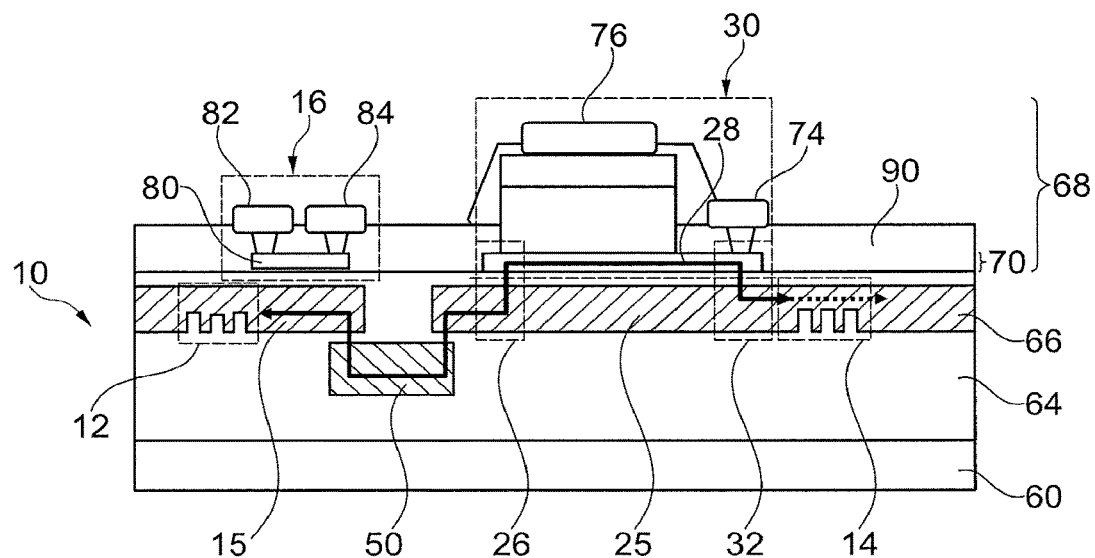
FIG. 8 is a schematic illustration, in vertical cross section, of a first embodiment of the laser source in FIG. 4.
Figure 14:
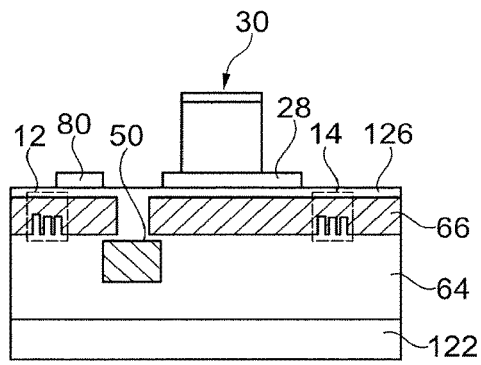

FIG. 8 shows a first exemplary embodiment of the laser source 10. The laser source 10 is produced using the same manufacturing processes as those used to manufacture CMOS (complementary metal-oxide semiconductor) components. Here, the laser source 10 is manufactured on the substrate 60 made of silicon that extends horizontally.

In FIG. 8, the laser source 10 includes successively stacked above the substrate 60, from bottom to top:
a layer 64 of silicon nitride, which layer is encapsulated in silicon oxide and contains the waveguide 50,
a layer 66 of silicon encapsulated in silicon oxide, in which layer the waveguides 15 and 25 and the reflectors 12 and 14 are produced, and
a layer 66 including the waveguide 28 inside of which the amplifier 30 is produced.

The adiabatic couplers 26 and 32 are partially produced in the waveguide 25 and in the waveguide 28.

Preferably, the amplifier 30 is a wideband amplifier, i.e. one capable of generating and amplifying a large range of wavelengths. This range comprises the wavelength $\lambda_{Li}$. Typically, it is centred on this wavelength $\lambda_{Li}$ at the temperature $(T_{max}+T_{min})/2$. The width of this wavelength range at −3 dB is for example at least 10 nm or 25 nm or 35 nm and remains large with the increase in temperature. For example, the III-V materials constituting the amplifier 30 are those described in the following article: Dimitris Fitsios et al. "*High-gain 1.3 μm GaInNAs semiconductor optical amplifier with enhanced temperature stability for all-optical processing and 10 Gb/s*" Applied Optics, May 2015 vol. 54, no. 1, 1 Jan. 2015. Producing the amplifier 30 in the way described in this article allows, in addition, a wideband amplifier that is stable with temperature to be obtained. This improves the operation of the laser source and in particular this allows the power emitted by the laser source to be kept almost constant over the entire range of operating temperatures [$T_{min}$; $T_{max}$]. In this case, the waveguide 28 and the amplifier 30 take the form of a stack of alternating sublayers made of GaInNAs and of GaNAs, which sublayers are interposed between a lower sublayer 70, and an upper sublayer made of p-doped GaAs. The sublayer 70 is a sublayer made of III-V material doped oppositely to the upper sublayer. For example, here, it is a question of a sublayer made of n-doped GaAs.

The amplifier 30 includes, in addition to the waveguide 28, a contact 74 making direct mechanical and electrical contact with the section of the sublayer 70 located under the stack of sublayers made of GaInNAs and GaNAs. The sublayer made of p-doped GaAs makes mechanical and electrical contact with a contact 76 for electrically connecting the upper portion of the amplifier 30 to a potential. When a current higher than the threshold current of the laser is applied between the contacts 74 and 76, the amplifier 30 generates and amplifies the optical signal that resonates inside the Fabry-Pérot cavity.

The tuning device 16 is here a heater able to heat the waveguide 15 in order to move the wavelengths $\lambda_{Rj}$.

In this embodiment, the tuning device 16 comprises a resistor 80 electrically connected to two electrical contacts 82 and 84 allowing a current to be made to flow through this resistor 80 so as to convert electrical energy into heat. These contacts 82 and 84 are electrically connected to a voltage or current source that is controlled by the electronics circuit 42 depending on the measurements of the sensor 40. The control of the tuning device 16 therefore here consists in adjusting the electrical power that passes through the resistor 80. Making a current flow through the resistor 80 allows the waveguide 15 to be heated and therefore the wavelengths $\lambda_{Rj}$ to be moved.

The resistor 80 is here a strip produced in the sublayer 70. This strip is therefore a strip made of n-doped GaAs. In this embodiment, it is logically located above the waveguide 15 the index variation $dn_{Si}/dT$ of which is clearly higher than the index variation $dn_j/dT$.

The tuning device 16, the waveguide 28 and the amplifier 30 are covered with a protective covering 90 that mechanically insulates them from the exterior. Only the contacts 74, 76, 82 and 84 protrude beyond the covering 90. For example, the covering 90 is made of silicon nitride.

The path of the resonant optical signal in the laser source 10 is represented in FIG. 8 by a double-headed arrow.

A process for manufacturing the laser source 10 will now be described with reference to the process in FIG. 9 and using FIGS. 10 to 14.

In a step 100, the process starts with the supply of an SOI (silicon-on-insulator) substrate 102. This substrate 102 (FIG. 10) includes from top to bottom the following layers successively stacked one on top of the other:
a substrate 104 made of silicon,
a layer 106 of silicon oxide, and
the layer 66 of silicon.

In a step 110, the waveguides 15 and 25 and the reflectors 12 and 14 are manufactured in the layer 66 made of silicon. For example, they are manufactured by photolithography and etching of this layer 66. In this step, the portions of the couplers 26 and 32 that are located in the layer 66 are also produced.

In a step 112, the layer 66 is encapsulated in a layer 114 (FIG. 11) of silicon oxide. This layer 114 is polished, i.e. planarized, for example, by a CMP (chemical-mechanical planarization) process, in order to planarize the top face of this layer 114.

In a step 116, a layer made of silicon nitride is deposited on the top face of the layer 114. Next, this layer made of silicon nitride is etched to form the waveguide 50 then encapsulated in silicon oxide. In FIG. 12 and the following figures, for the sake of simplicity, the waveguide 50 is represented in the form of a block of silicon nitride. The layer 64 (FIG. 12) of silicon nitride encapsulated in silicon oxide is thus obtained. The top face of the layer 64 is then polished, for example, as described with reference to step 112.

In a step 120, a substrate 122 (FIG. 13) is bonded to the exterior face made of silicon oxide of the layer 64. The substrate 122 is a substrate made of silicon that comprises above a thick layer of silicon oxide. It is these layers of silicon oxide that are bonded to each other.

In a step 124, the layer 104 made of silicon is removed, and the layer 106 is thinned in order to leave only a thin intermediate layer 126 (FIG. 14) of silicon oxide. The exterior face of the layer 126 is polished as described with reference to step 112.

In a step 128, the layer 68 made of III-V gain material is bonded or deposited on the layer 126. For example, the layer 68 (FIG. 8) made of III-V gain material is bonded to the exterior face of the layer 126. The layer 68 comprises the lower sublayer 70, the stack of alternating sublayers made of GaInNAs and of GaNAs and the doped upper sublayer.

Once step 128 has been carried out, in a step 130, the layer 68 is etched to manufacture the waveguide 28, the amplifier 30 and the resistor 80. Typically, in a first etch, the upper sublayers of the layer 68 are etched to structure the amplifier 30. Next, in a second etch, the sublayer 70 is etched to finalize the structuring of the amplifier 30 and to produce the resistor 80.

Lastly, in a step 132, the covering 90 and the contacts 74, 76, 82 and 84 are produced. The laser source, a cross-sectional view of which is shown in FIG. 8, is thus obtained.

Figure 18:
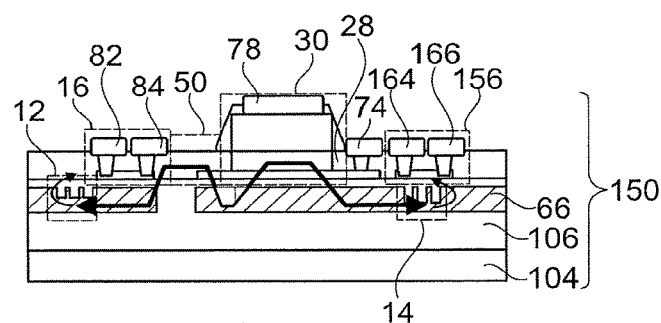

FIG. 15 shows a second process for manufacturing a laser source 150 (FIG. 18). This process starts with the steps 110 and 112 described above with reference to the process in FIG. 9.

Figure 16:
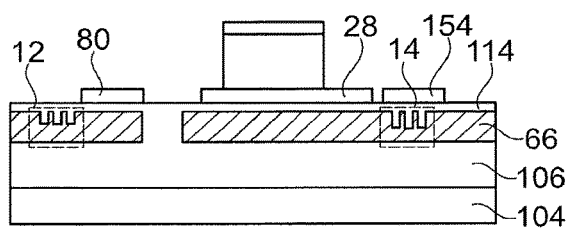
FIGS. 16 to 18 are schematic illustrations, in vertical cross section, of various stages of manufacture of a semiconductor laser source according to the process in FIG. 15.

Next, it continues with a step 152 in which a layer that is identical to the layer 68 described above is bonded to or deposited on the layer 114 (FIG. 16). Typically, this layer is bonded by direct bonding.

Next, in a step 158, this layer is etched to manufacture the waveguide 28, the amplifier 30, the resistor 80 and an additional resistor 154 (FIG. 16). For example, this is done as described with reference to step 128.

The resistor 154 is used to produce a tuning device 156 (FIG. 18) that, for example, is identical to the tuning device 16 except that the latter allows the reflection band 4 of the reflector 14 to be moved depending on an electrical controlling signal generated by the electronics circuit 42. This electronic signal for controlling the tuning device 156 is typically generated depending on the measurements of the sensor 40. This allows, if necessary, the width ΔR of the reflection band of the reflectors to be decreased. For example, in this case, it may be as small as N×Δv$_f$, The resistor 154 is located above the reflector 14.

Figure 17:
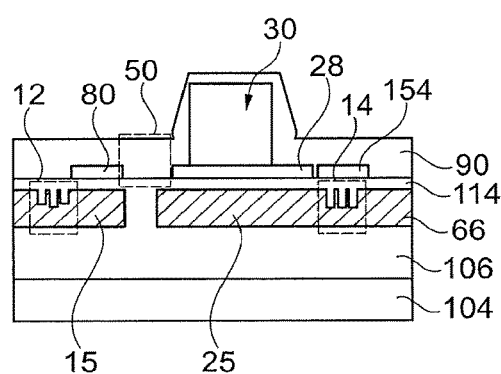

In a step 160, the protective covering 90 is produced. In this step, the waveguide 50 is manufactured in the covering 90, which is made of silicon nitride. For example, the waveguide 50 is manufactured by photolithography and etching of the covering 90 in proximity to the ends of the waveguides 15 and 25 (FIG. 17).

In a step 162, the contacts 74, 76, 82 and 84 are manufactured. The contacts 164 and 166 that mechanically and electrically connect the resistor 154 are also manufactured in order to allow a current to be made to flow through this resistor 154. The combination of the resistor 154 and the contacts 164 and 166 forms the tuning device 156. Thus, the laser source 150 shown in FIG. 18 is obtained.

In FIG. 18, the path of the resonant optical signal in the laser source 150 is represented by a double-headed arrow.

The laser source 150 is identical to the laser source 10, except that the waveguide 50 and the waveguide 28 are both placed on the same side of the layer 66. In addition, in the laser source 150, the reflectors 12 and 14 are turned upward and not downward, as in the laser source 10. This allows the output of the reflector 14 to be connected to an optical fibre positioned above the laser source 150.

The laser source 150 operates in the same way as the laser source 10, except that the electronic circuit 42 is here in addition suitable for controlling the tuning device 156 so as to tune, in addition, the reflectors 12 and 14.

FIG. 19 shows a laser source 180 that is identical to the laser source 10, except that:
the reflectors 12 and 14 have been replaced by reflectors 182 and 184, respectively, and
the tuning device 16 is located, for example, above the waveguide 25 and no longer above the waveguide 15.

The reflectors 182 and 184 are identical to the reflectors 12 and 14, respectively, except that they are produced in the same layer made of silicon nitride as the waveguide 50. For example, here the reflector 182 is produced at one end of a waveguide 186 made of silicon nitride, the other end of which waveguide is optically connected to the waveguide 50 of the ring of the filter 22 by evanescent coupling. Therefore, the waveguide 15 is omitted. The waveguide 50 of the ring is optically connected to the waveguide 25 by evanescent coupling as described above. Similarly, the reflector 184 is produced at the end of a waveguide 188 made of silicon nitride, the other end of which waveguide is optically connected, by adiabatic coupling, to the waveguide 25.

In this case, preferably, the width $\Delta R$ of the reflection band of the reflectors 182 and 184 is larger than $DT \times (d\lambda_{Cf}/dT)$.

The couplers that optically connect the waveguides 25 and 28 together are adiabatic couplers.

It will be noted that producing the reflectors 182 and 184 in a waveguide made of silicon nitride allows their bandwidth to be decreased. This also allows the interval $\Delta v_f$ of the filter 22 needed to obtain a monochromatic laser source to be decreased.

In FIG. 19, the path of the resonant optical signal is represented by a double-headed arrow.

The laser source 180 has the advantage that the reflection band 4 of the reflectors 182 and 184 moves much less rapidly than in the laser sources 10 or 150. Specifically, in this embodiment, the variation $d\lambda_{CR}/dT$ in the central wavelength $\lambda_{CR}$ is equal to the variation $d\lambda_{Cf}/dT$. Thus, whatever the variation in temperature, the passband 6 always remains inside the reflection band 4 and does not move with respect to the upper and lower limits of this reflection band 4. The width $\Delta R$ of the reflection band 4 may thus be small. Typically, the width $\Delta R$ is strictly larger than $DT \times d\lambda_{Cf}/dT + \Delta\lambda_f$.

FIG. 20 shows a laser source 190 that is identical to the laser source 180 except that the reflectors 12 and 14 have been replaced by reflectors 192 and 194 partially produced in the layer 64 and partially in the layer 66. Thus, the reflectors are partially produced from silicon nitride and partially from silicon. Typically, each reflector 192 and 194 is formed from two facing Bragg gratings, one in the waveguide made of silicon nitride and one in the waveguide made of silicon.

FIG. 21 shows a laser source 200 that is identical to the laser source 150 except that the tuning device 16 has been replaced by a tuning device 202. The tuning device 202 includes an n- or p-doped portion forming a resistor 204 produced in one of the waveguides 15 or 25. In FIG. 21, the portion 204 is produced in the waveguide 15. The tuning device 202 also includes contacts 206 and 208 for connecting the resistor 204 to the electronics circuit 42. The operation of the laser source 200 may be deduced from that of the laser source 150.

FIG. 22 shows an N-wavelength or polychromatic laser source 220. The laser source 220 is identical to the laser source 10 except that the filter 22 has been replaced by a filter 222, and the reflectors 12 and 14 have been replaced by reflectors 224 and 226, respectively.

The filter 222 is identical to the filter 22 except that the dimensions of the filter 22 have been modified so that it has a plurality of passbands simultaneously located inside the reflection band of the reflectors 224 and 226. In this embodiment, the filter 222 is a ring resonator produced in the waveguide 50, which is optically connected to the waveguides 15 and 25 by evanescent coupling.

Figure 23:
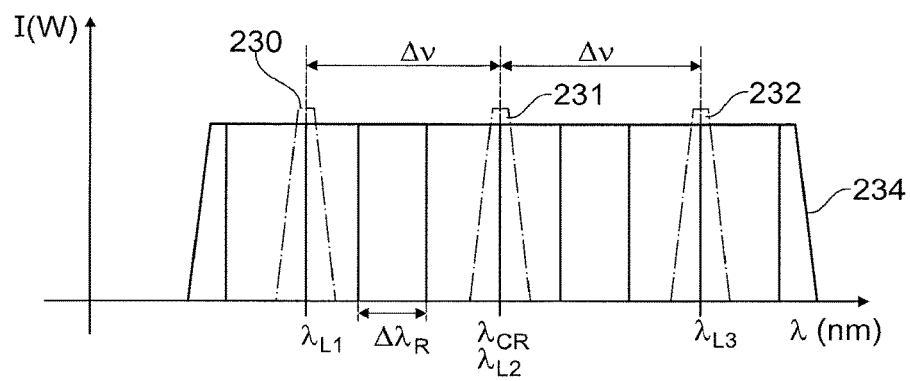
FIG. 23 is a graph schematically illustrating the position of the reflection band of the reflectors of the laser source in FIG. 22 with respect to the passbands of a filter of this laser source.

In the graph in FIG. 23, the three passbands 230 to 232 of the filter 222 are shown as being located inside the reflection band 228 of the reflectors 224 and 226. The central wavelengths of these passbands are denoted $\lambda_{Cf1}$, $\lambda_{Cf2}$ and $\lambda_{Cf3}$, respectively. In the case of a multi-wavelength laser source, the symbol $\lambda_{Cf}$ is used to designate any one of the central wavelengths $\lambda_{Cf1}$, $\lambda_{Cf2}$ and $\lambda_{Cf3}$. Each of these passbands 230 to 232 is for example identical to the passband 6. In addition, the interval $\Delta v_f$ between two of these successive passbands is an integer multiple of the interval $\Delta\lambda_R$ and strictly smaller than the width $\Delta R$ of the reflection band 234.

Preferably, the width $\Delta R$ of the reflection band 234 of the reflectors 224 and 226 is:
larger than $DT \times (d\lambda_{CR}/dT)$ if $N \times \Delta v_f < DT \times (d\lambda_{CR}/dT)$, and
larger than $N \times \Delta v_f + DT \times (d\lambda_{CR}/dT)$ if $N \times \Delta v_f > DT \times d\lambda_{CR}/dT$,
where N is an integer higher than or equal to two and equal to the number of wavelengths $\lambda_{Rj}$ selected by the filter 222.

The operation of the laser source 220 is identical to that of the laser source 10 except that it simultaneously emits N wavelengths that are here denoted $\lambda_{L1}$, $\lambda_{L2}$ and $\lambda_{L3}$.

Figure 24:
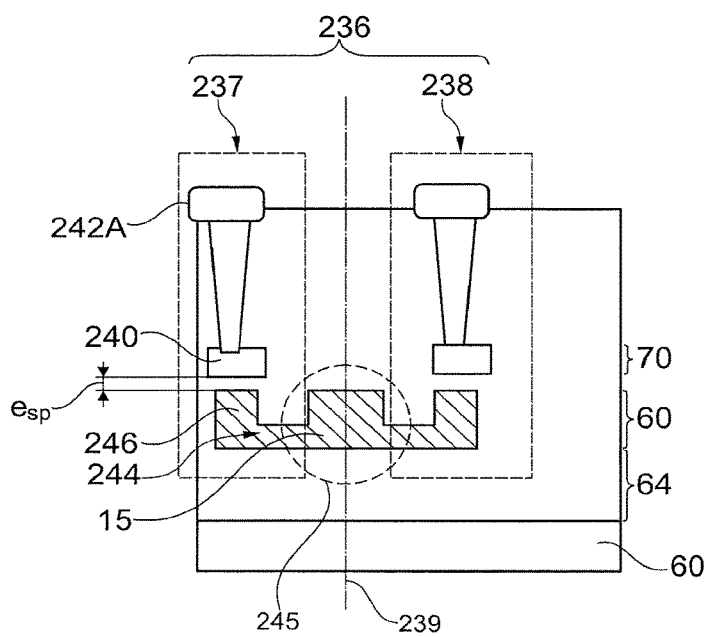
FIG. 24 is a schematic illustration, in vertical cross section, of one particular embodiment of a tuning device usable in a laser source.
Figure 25:
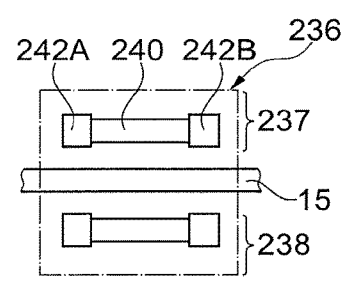
FIG. 25 is a schematic illustration, seen from above, of the tuning device in FIG. 24.

FIGS. 24 and 25 show a tuning device 236 suitable for advantageously replacing the device 16. FIG. 24 is a vertical cross-sectional view of the device 236 along a transverse cross-sectional plane perpendicular to the waveguide 15. Just like the device 16, the device 236 is able to heat the waveguide 15 made of silicon depending on an electrical controlling signal. The device 236 includes two heaters 237 and 238 that are symmetric with respect to a vertical plane 239 (FIG. 24) passing through the centre of the waveguide 15. To simplify the description, only the heater 237 is described in detail. The heater 237 for example includes the same elements as the device 16. In particular, it includes a resistor 240 produced in the sublayer 70 and two contacts 242A and 242B for making a current flow through the resistor 240. In FIG. 24, only a single contact 242A may be seen.

The heater 237 in addition includes a lateral arm 244 produced from silicon in the layer 60. The arm 244 is in thermal continuity with the waveguide 15, that is the arm 244 is directly thermally coupled with the waveguide 15. This arm 244 extends in a transverse horizontal direction from the waveguide 15 leftward. Its thickness in the vertical direction is smaller than that of the waveguide 15. More precisely, its dimensions are such that the optical signal cannot propagate inside the arm 244 and remains mainly confined inside a zone 245 that encircles the waveguide 15. At its end opposite the waveguide 15, in this embodiment, the arm 244 has a distal section 246 facing the resistor 240. The distal section 246 is separated from the resistor 240 by a thin layer of silicon oxide of thickness $e_{SP}$. typically, the thickness $e_{SP}$ is equal to the thickness of silicon oxide that separates the waveguide 28 from the waveguide 25. Thus, the distal portion 246 forms a bulge. Here, the thickness of the distal section 246 is equal to the thickness of the waveguide 15. The arm 244 forms a single block of material with the waveguide 15.

During the operation of the device 236, the resistor 240 preferentially heats the distal section 246, then, by thermal conduction via the arm 244, the heat is transmitted to the waveguide 15. The waveguide 15 is therefore heated in turn, thereby making its refractive index vary. In this embodiment, the resistor 240 is placed outside of the zone 245 in which the resonant signal circulates. In particular, the resistor 240 is not located, in the vertical direction, above and facing the waveguide 15. Thus, optical losses are limited even though it is still possible to effectively heat this waveguide. Specifically, by way of comparison, in the device 16 the resistor 80 is facing the waveguide 15 and located inside the zone 245, thereby causing optical losses. Here, the heater 237 does not heat the waveguide 15 directly but mainly heats it via the arm 244 that conveys no optical signal.

Figure 26:
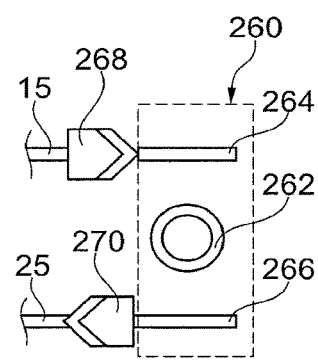
FIG. 26 is a schematic illustration, seen from above, of another embodiment of a filter for the laser source in FIG. 4.

FIG. 26 shows a filter 260 capable of being used instead of the filter 22. The filter 260 includes:
a waveguide 262 made of silicon nitride forming a ring resonator, and
two waveguides 264 and 266 made of silicon nitride, which waveguides are located in the same plane as the waveguide 262 and are optically connected to the waveguide 262 by evanescent coupling.

Typically, the coupling factors of the evanescent coupling between the waveguide 262 and the waveguides 264, 266 are the same as those described in the case of the filter 22. The two waveguides 264, 266 are optically connected via adiabatic couplers 268 and 270, respectively, to the waveguides 15 and 25. In this embodiment, the waveguide 262 is not directly optically connected to the waveguides 15 and 25, but connected to these waveguides via waveguides 264 and 266 made of silicon nitride.

Many other embodiments are possible. For example, the tuning device 16 or 156 may be omitted. Conversely, an additional tuning device, such as the tuning device 156, may be added to any of the embodiments described above to move the reflection band of the reflectors.

The tuning device is not necessarily a heater. For example, it is also possible to use by way of tuning device a p-n junction produced in one of the waveguides made of silicon. The refractive index of the silicon level with this p-n junction varies depending on the bias of this junction. The electronic signal for controlling the tuning device then makes the bias of this p-n junction vary. This way of making the refractive index of the silicon vary is for example described in more detail in the following article: G. T. Reed et al., "Silicon optical modulators", Nature Photonics, vol. 4, August 2010.

The reflection coefficients of the front and back reflectors may also be equal.

If the filter 22 of the laser source 180 is replaced by the filter 222, then the width ΔR of the reflection band of the reflectors 182 and 184 may be decreased. However, preferably, it is larger than N× $\Delta v_f$+DT×(d$\lambda_{Cf}$/dT), where N is an integer higher than or equal to two and equal to the number of wavelengths $\lambda_{Rj}$ selected by the filter 222.

Other embodiments of the waveguide 28 and the amplifier 30 are possible. Typically, the waveguide 28 includes in succession, starting from the substrate 60: a doped lower sublayer, a stack of quantum wells made of quaternary material and a doped upper sublayer the doping of which is of opposite type to the doping of the lower sublayer. The doped sublayer 70 may be produced from other material such as from p- or n-doped InP. In this case, the stack of quantum wells includes sublayers made of InGaAsP or of GaInNAs, etc. For an exemplary embodiment of a wideband amplifier that is stable with temperature and in which the sublayer 70 is made of InP, the reader may refer to the following article: K. Morito et al. "GaInNAs/InP Tensile-Strained Bulk Polarization-Insensitive SOA", ECOC2006, IEEE. When the lower and upper sublayers are made of GaAs, the stack of quantum wells may be produced with sublayers made of AlGaAs. The doping type of the upper and lower sublayers may be inverted.

As a variant, the waveguide 28 and the amplifier 30 are optically connected to the waveguides 15 and 25 by evanescent coupling. In this case, the adiabatic couplers 26 and 32 are omitted. Such an optical connection between the amplifier and waveguides made of silicon is for example described in the following article: A. W. Fang et al., "Electrically pumped hybrid AlGaInAs-silicon evanescent laser", Optics Express, vol. 14, pp. 9203-9210 (2006).

Other embodiments of the sensor 40 are also possible. For example, as a variant, the sensor 40 may be replaced by a sensor that measures the operating temperature of the laser source. Specifically, with each operating temperature of the laser source, it is possible to associate a difference between the wavelengths $\lambda_{Cfl}$ and $\lambda_{Rj}$. In this case, for example, the electronics circuit 42 includes a pre-recorded table that associates, with a plurality of operating temperatures of the laser source, the characteristics of the electrical controlling signal to be generated to keep the wavelength $\lambda_{Li}$ at the centre of the passband 6 of the filter. For example, this pre-recorded table is constructed experimentally. The temperature of the laser source may be measured using a transducer, such as a p-n junction. Specifically, the electrical properties of a p-n junction vary as a function of temperature.

As a variant, the heater 238 is omitted. In this case, the device 236 is no longer symmetric with respect to the plane 239. In another variant, the bulge 246 is omitted.

Other embodiments of the filter are possible. For example, the ring resonator may be replaced by an array waveguide grating (AWG). In the latter case, the filter is coupled to the waveguide made of silicon by adiabatic couplers such as the adiabatic couplers 268 and 270 shown in FIG. 26 and not by evanescent coupling.

It is also possible to use materials other than silicon nitride. For example, it is also possible to use, by way of material that is less sensitive to temperature, aluminium nitride.

A laser source that emits it a plurality of wavelengths $\lambda_{Li}$ may also be produced as described, for example, with reference to FIGS. 2 and 6 of the following article: Katarzyna Lawmiczuk et al. "*Design of integrated photonic transmitter for applications in fiber-to-the-home systems*" Photonics Applications in Astronomy, Communications, Industry and High-Energy Physics Experiments 2010 Proceedings of SPIE, vol. 7745, 2010. In this case, the filter is an array waveguide grating (AWG). It is then this AWG component that is produced in the material that is less sensitive to temperature.

Other manufacturing processes are possible. For example, the process described with reference to FIG. 17 of the following article may easily be adapted to manufacture a laser source such as the laser source 150: Martijn J. R. Heck et al, "*Ultra-low loss waveguide platform and its integration with silicon photonics*", Laser Photonics Rev. 8, No. 5, pages 667-686 (2014). More precisely, the waveguide 50 is manufactured in a first substrate. Next, a second SOI substrate is bonded to the first substrate. The waveguides 15 and 25 are then produced in the layer made of silicon of this second substrate. Lastly, the layer 68 is bonded above the waveguide made of silicon and the amplifier 30 is produced in this layer 68.

In another embodiment, the intermediate layer 126 is obtained by removing the layer 106 in its entirety, then by depositing on the exposed layer 66 a layer of silicon oxide.

Lastly, the order in which the various photonics components are arranged inside the Fabry-Pérot cavity may be modified. For example, the filter 22 may be placed between the coupler 32 and the reflector 14.

The tuning device 236 may be used in any semiconductor photonics system in which it is necessary to heat an optical waveguide while limiting losses. In particular, it may be used to heat a waveguide of a system other than a laser source. This other system may be a modulator for modulating the phase or intensity of an optical signal.

The invention claimed is:

1. A semiconductor laser source able to emit at least one wavelength $\lambda_{Li}$, said laser source comprising:
   a front reflector and a back reflector, said front and back reflectors forming the ends of a Fabry-Pérot optical cavity to resonate an optical signal at a plurality of possible resonant frequencies, possible wavelengths $\lambda_{Rj}$ of said possible resonant frequencies being regularly spaced apart from one another by an interval $\Delta\lambda_R$ and all comprised inside a reflection band of the front and back reflectors, the reflection band being centred on a wavelength $\lambda_{CR}$ and being of width $\Delta R$,
   a set of waveguides optically connecting the front and back reflectors together, said set including:
      a silicon waveguide made of silicon,
      a passband filter produced in a waveguide and arranged to be passed through by the optical signal resonating between the front and back reflectors, said passband filter being configured to select at least one wavelength $\lambda_{Li}$ from the wavelengths $\lambda_{Rj}$, the passband filter including a passband centred on each wavelength $\lambda_{Li}$ to be selected, each passband of the filter being centred on a respective central wavelength $\lambda_{Cf}$ and having a bandwidth $\Delta\lambda_f$ smaller than or equal to the interval $\Delta\lambda_R$,
      a III-V gain material waveguide made of III-V gain material to generate optical gain at each wavelength $\lambda_{Li}$ selected by the filter and arranged to be passed through by the optical signal resonating between the front and back reflectors, said III-V gain material waveguide being optically coupled to the silicon waveguide made of silicon by adiabatic or evanescent coupling,
wherein:
   the waveguide in which the filter is produced is made of material that is less sensitive to temperature, and produced from a material of a variation $dn_f/dT$ in a refractive index as a function of temperature of which is at least two times lower than a variation $dn_{Si}/dT$ in a refractive index of silicon as a function of temperature, and
   the laser source also includes:
      a tuning device to shift the wavelengths $\lambda_{Rj}$ in response to an electrical controlling signal,
      a sensor to measure a physical quantity representative of a difference between the central wavelength $\lambda_{Cf}$ and one of the possible wavelengths $\lambda_{Rj}$,
      an electronic circuit able to generate, depending on the physical quantity measured by the sensor, the electrical signal controlling the tuning device in order to keep one wavelength $\lambda_{Rj}$ at the centre of each passband of the filter that selects a wavelength $\lambda_{Li}$, and
   the width $\Delta R$ of the reflection band of each front and back reflector is:
      strictly larger than $\Delta\lambda_f + DT \times (d\lambda_{CR}/dT)$ if the filter is arranged to solely select a single wavelength $\lambda_{Li}$, and
      strictly larger than $\Delta\lambda_f + \max\{DT \times (d\lambda_{CR}/dT); N \times \Delta v_f + DT \times (d\lambda_{Cf}/dT)\}$ if the filter is arranged to select N wavelengths $\lambda_{Li}$,
   where DT is the width of a preset range of operating temperatures of the laser source, $d\lambda_{CR}/dT$ is a variation in the central wavelength $\lambda_{CR}$ of the reflectors as a function of temperature expressed in nm/° C.; $d\lambda_{Cf}/dT$ is a variation in the central wavelength $\lambda_{Cf}$ of the filter as a function of temperature expressed in nm/° C., N is an integer higher than or equal to two, $\Delta v_f$ is an interval between two successive passbands of the filter expressed in manometers and max{ } is a function that returns a highest element among elements listed in the function.

2. The laser source according to claim 1, emitting solely at a single wavelength $\lambda_{Li}$, wherein the filter includes a ring resonator and the passbands of said filter are regularly spaced apart from one another by an interval $\Delta v_f$ wider than the width $\Delta R$.

3. The laser source according to claim 1, emitting simultaneously at a plurality of wavelengths $\lambda_{Li}$, wherein the filter includes a ring resonator and the passbands of said filter are regularly spaced apart from one another by an interval $\Delta v_f$ equal to an integer multiple of the interval $\Delta\lambda_R$ and strictly smaller than the width $\Delta R$.

4. The laser source according to claim 2, wherein the laser source comprises:
   a substrate that essentially extends in a plane called "plane of the substrate", and
   the silicon waveguide made of silicon, which extends parallelly to the plane of the substrate inside a first layer, said silicon waveguide made of silicon guiding the optical signal resonating between the front and back reflectors, and
   the waveguide in which the ring resonator is produced extends entirely in a second layer that is placed above or below the first layer, the waveguide in which the ring resonator is produced being optically connected to the silicon waveguide made of silicon solely by evanescent coupling.

5. The laser source according to claim 1, wherein the laser source comprises:
a substrate that essentially extends in a plane called "plane of the substrate", and
the silicon waveguide made of silicon, which extends parallelly to the plane of the substrate inside a first layer, said silicon waveguide made of silicon guiding the optical signal resonating between the front and back reflectors, and
the waveguide made of material that is less sensitive to temperature extends parallelly to the plane of the substrate inside a second layer that is placed above or below the first layer and said waveguide made of material that is less sensitive to temperature being optically connected to the silicon waveguide made of silicon by evanescent or adiabatic coupling, and
the III-V gain material waveguide made of III-V gain material extends parallelly to the plane of the substrate inside a third layer that is located on that side of the first layer which is opposite the side on which the second layer is located.

6. The laser source according to claim 1, wherein the laser source comprises:
a substrate that essentially extends in a plane called "plane of the substrate", and
the III-V gain material waveguide made of III-V gain material includes a sublayer made of n- or p-doped III-V material that extends in a plane parallel to the plane of the substrate, and
the tuning device includes:
a resistor produced from the same material and with the same doping as said sublayer made of p- or n-doped III-V material, said resistor extending above or below the silicon waveguide made of silicon in the same plane as the sublayer made of n- or p-doped III-V material, and
electrical contacts to make an electrical current flow inside said resistor in order to heat the silicon waveguide made of silicon located above or below in response to the electrical controlling signal.

7. The laser source according to claim 1, wherein the material that is less sensitive to temperature is silicon nitride or aluminium nitride.

8. The laser source according to claim 1, wherein the tuning device comprises:
a lateral arm made of silicon that extends, in a lateral direction perpendicular to a longitudinal axis of the silicon waveguide made of silicon, from the silicon waveguide made of silicon as far as a distal section, said lateral arm having a thickness, in a vertical direction perpendicular to the longitudinal axis, smaller than the thickness of the silicon waveguide made of silicon in the same vertical direction, and
a resistor located facing the distal section and outside of the zone through which the resonant optical signal guided by the silicon waveguide made of silicon circulates, and electrical contacts to make the electrical controlling signal flow through the resistor.

9. The laser source according to claim 1, wherein the front and back reflectors are at least partially produced from the material that is less sensitive to temperature.

10. The laser source according to claim 1, wherein the front and back reflectors are Bragg gratings.

11. The laser source according to claim 1, wherein the width DT of the preset range of operating temperatures of the laser source is larger than 30° C.

12. A process for manufacturing a laser source, said process comprising:
manufacturing a front reflector and a back reflector, said front and back reflectors forming ends of a Fabry-Pérot optical cavity to resonate an optical signal at a plurality of possible resonant frequencies, possible wavelengths $\lambda_{Rj}$ of said possible resonant frequencies being regularly spaced apart from one another by an interval $\Delta\lambda_R$ and all comprised inside a reflection band of the front and back reflectors, the reflection band being centred on a wavelength $\lambda_{CR}$ and being of width $\Delta R$;
manufacturing a set of waveguides optically connecting the front and back reflectors together, said set including:
a silicon waveguide made of silicon,
a passband filter produced in a waveguide and arranged to be passed through by the optical signal resonating between the front and back reflectors, said passband filter being configured to select at least one wavelength $\lambda_{Li}$ from the wavelengths $\lambda_{Rj}$, the passband filter including a passband centred on each wavelength $\lambda_{Li}$ to be selected, each passband of the filter being centred on a respective central wavelength $\lambda_{Cf}$ and having a bandwidth $\Delta\lambda_f$ smaller than or equal to the interval $\Delta\lambda_R$,
a III-V gain material waveguide made of III-V gain material to generate optical gain at each wavelength $\lambda_{Li}$ selected by the filter and arranged to be passed through by the optical signal resonating between the front and back reflectors, said MN gain material waveguide being coupled to the silicon waveguide made of silicon by adiabatic or evanescent coupling,
wherein:
the manufacturing of the set of waveguides includes manufacturing the waveguide in which the filter is produced from a material that is less sensitive to temperature, and produced from a material of a variation $dn_f/dT$ in a refractive index as a function of temperature of which is at least two times lower than a variation $dn_{Si}/dT$ in a refractive index of silicon as a function of temperature;
manufacturing a tuning device to shift the wavelengths $\lambda_{Rj}$ in response to an electrical controlling signal;
manufacturing a sensor to measure a physical quantity representative of a difference between the central wavelength $\lambda_{Cf}$ and one of the possible wavelengths $\lambda_{Rj}$; and
manufacturing an electronic circuit to generate, depending on the physical quantity measured by the sensor, the electrical signal controlling the tuning device in order to keep one wavelength $\lambda_{Rj}$ at the centre of each passband of the filter that selects a wavelength $\lambda_{Li}$,
the manufacturing of the front reflector and of the back reflector also includes arranging said reflectors so that the width $\Delta R$ of the reflection band of each front and back reflector is:
strictly wider than $\Delta\lambda_f + DT \times (d\lambda_{CR}/dT)$ if the filter is arranged to solely select a single wavelength $\lambda_{Li}$, and
strictly wider than $\Delta\lambda_f + \max\{DT \times (d\lambda_{CR}/dT); N \times \Delta v_f + DT \times (d\lambda_{CF}/dT)\}$ if the filter is arranged to select N wavelengths $\lambda_{Li}$,
where DT is the width of a preset range of operating temperatures of the laser source, $d\lambda_{CR}/dT$ is a variation in the central wavelength $\lambda_{cR}$ of the reflectors as a function of temperature expressed in nm/° C., $d\lambda_{Cf}/dT$ is a variation in the central wavelength $\lambda_{Cf}$ of the filter as a function of temperature expressed in nm/° C., N is an integer higher than or equal to two, $\Delta v_f$ is an interval between two successive passbands of the filter expressed in manometers and max{ } is a function that returns a highest element among elements listed in the function.

13. The process according to claim 12, further comprising:
    manufacturing the front and back reflectors and the silicon waveguides made of silicon in a front-side silicon first layer of a first silicon-on-insulator (SOI) substrate, said first SOI substrate including a first silicon substrate separated from the first layer by a first silicon-oxide layer, then
    before the first waveguide made of gain material is manufactured, manufacturing the filter, the manufacture of the filter including, in succession: depositing, on a front side of the first layer, a layer produced from the material that is less sensitive to temperature, then etching said deposited layer to form the waveguide in which the filter is produced, then encapsulating the filter in a silicon-oxide layer, and lastly polishing said silicon-oxide layer, then
    bonding the exterior face of the polished silicon-oxide layer on a second substrate, then
    removing the first silicon substrate and at least some of the first oxide layer of the first SOI substrate to obtain a bonding face located, with respect to the first silicon layer, on the opposite side to that on which the filter is found, then
    bonding or depositing a layer made of III-V gain material on said bonding face, then
    manufacturing the III-V gain material waveguide made of gain material in said bonded layer made of III-V gain material.

* * * * *